United States Patent [19]

Stallmo

[11] Patent Number: 5,208,813
[45] Date of Patent: May 4, 1993

[54] ON-LINE RECONSTRUCTION OF A FAILED REDUNDANT ARRAY SYSTEM

[75] Inventor: David C. Stallmo, Boulder, Colo.

[73] Assignee: Array Technology Corporation, Boulder, Colo.

[21] Appl. No.: 601,912

[22] Filed: Oct. 23, 1990

[51] Int. Cl.$^5$ ............................................. G06F 11/20
[52] U.S. Cl. ................................ 371/10.1; 371/11.1; 364/268.5; 364/269.2; 395/575
[58] Field of Search ................ 371/10.1, 10.2, 11.1; 395/575; 364/268.5, 269.2

[56] References Cited

U.S. PATENT DOCUMENTS

| | | | |
|---|---|---|---|
| 3,893,178 | 7/1975 | Sordello | 360/73 |
| 4,092,732 | 5/1978 | Ouchi | 364/900 |
| 4,467,421 | 8/1984 | White | 364/200 |
| 4,562,576 | 12/1985 | Ratcliffe | 371/21 |
| 4,667,326 | 5/1987 | Young et al. | 371/40 |
| 4,722,085 | 1/1988 | Flora et al. | 371/38 |
| 4,754,397 | 6/1988 | Varaiya et al. | 364/200 |
| 4,761,785 | 8/1988 | Clark et al. | 371/2.2 |
| 4,768,193 | 8/1988 | Takemae | 371/10 |
| 4,775,978 | 10/1988 | Hartness | 371/38 |
| 4,817,035 | 3/1989 | Timsit | 364/900 |
| 4,849,929 | 7/1989 | Timsit | 371/10.1 |
| 4,870,643 | 9/1989 | Bultman et al. | 371/11.1 |
| 4,899,342 | 2/1990 | Potter et al. | 371/10.1 |
| 4,914,656 | 4/1990 | Dunphy, Jr. et al. | 371/10.2 |
| 4,989,206 | 1/1991 | Dunphy, Jr. et al. | 371/10.1 |
| 4,993,030 | 2/1991 | Krakuer et al. | 371/40.1 |
| 5,088,081 | 2/1992 | Farr | 369/54 |
| 5,130,992 | 7/1992 | Frey, Jr. et al. | 371/40.1 |
| 5,134,619 | 7/1992 | Henson et al. | 371/40.1 |

OTHER PUBLICATIONS

Patterson et al., A Case for Redundant Arrays of Inexpensive Disks (RAID), Dept. of Elect. Engr. and Computer Sciences, Univ. of Cal., Berkeley, 1988 ACM 0-89791-268-3/88/006/0109, pp. 109–116.
Lee, E. K.; Software and Performance Issues in the Implementation of a RAID Prototype (May 1990).
Chen, P., Gibson, G., Katz, R. H., Patterson, D. A., and Schulze, M.; Introduction to Redundant Arrays of Inexpensive Disks (RAID (Dec. 1988).
Chen, P., Gibson, G., Katz, R. H., Patterson, D. A., and Schulze, M., et al. Evolution of the Raid 2 Architecture (Jun. 12, 1990).
Maximum Strategy, Inc., San Jose, Calif.; Strategy 2 Disk Array Controller Operation Manual (Nov. 2, 1988).
Maximum Strategy, Inc., San Jose, Calif.; Strategy 1 Disk Array Controller Operation Manual (Date unknown).
Gibson, G. A., Performance and Reliability in Redundant Arrays of Inexpensive Disks (Date Unknown).
Chen, P., An Evaluation of Redundant Arays of Disks Using an Amdahl 5890; (May 1989).
Katz, R. H., Gibson, G. A., and Patterson, D. A.,; Disk System Architectures for High Performance Computing (Mar. 1989).
Gray, J., Horst, B., and Walker, M.; Parity Striping of Disc Arrays: Low-Cost Reliable Storage with Acceptable Throughtput (Jan. 1990).
Schultz, M. E.; Considerations in the Design of a Raid Prototype (Aug. 1988).
Clark, and Corrigan; IBM Systems Journal, vol. 23, No. 3, 1989.

*Primary Examiner*—Charles E. Atkinson
*Attorney, Agent, or Firm*—Spensley Horn Jubas & Lubitz

[57] ABSTRACT

A method for on-line reconstruction of a failed storage unit in a redundant array system. After providing a replacement storage unit for the failed storage unit, reconstruction begins for each data stripe in the array. General reconstruction consists of applying an error-correction operation (such as an XOR operation on data blocks and a corresponding parity block) to the data blocks from the remaining storage units in the redundancy group, and storing the result in the corresponding block of the replacement storage unit. If a Read operation is requested by the CPU for a data block on the replacement storage unit, then a concurrent Read task is executed which reconstructs the stripe containing the requested data block. If a Read operation is requested by the CPU for a data block not on the replacement storage unit, a concurrent Read task is executed which performs a normal Read. If a Write operation is requested for any data block, then a concurrent Write task is executed which performs a Read-Modify-Write sequence in the general case (the Read operation being performed in accordance with the above rules).

17 Claims, 5 Drawing Sheets

|   | S1 | S2 | S3 | S4 | S5 |
|---|---|---|---|---|---|
| A | ① | 1 | 0 | 1 | 1 |
| B | 1 | ⓪ | 0 | 1 | 0 |
| C | 0 | 1 | ⓪ | 0 | 1 |
| D | 1 | 1 | 1 | ① | 0 |
| E | 0 | 0 | 0 | 1 | ① |
| F | ① | 0 | 1 | 0 | 0 |
| G | 1 | ① | 1 | 1 | 0 |
| H | 0 | 0 | ① | 1 | 0 |

FIG. 2A

|   | S1 | S2 | S3 | S4 | S5 |
|---|---|---|---|---|---|
| A | – | 1 | 0 | 1 | 1 |
| B | – | ⓪ | 0 | 1 | 0 |
| C | – | 1 | ⓪ | 0 | 1 |
| D | – | 1 | 1 | ① | 0 |
| E | – | 0 | 0 | 1 | ① |
| F | – | 0 | 1 | 0 | 0 |
| G | – | ① | 1 | 1 | 0 |
| H | – | 0 | ① | 1 | 0 |

FIG. 2B

|   | S1' | S2 | S3 | S4 | S5 |
|---|---|---|---|---|---|
| A | X | 1 | 0 | 1 | 1 |
| B | X | ⓪ | 0 | 1 | 0 |
| C | X | 1 | ⓪ | 0 | 1 |
| D | X | 1 | 1 | ① | 0 |
| E | X | 0 | 0 | 1 | ① |
| F | X | 0 | 1 | 0 | 0 |
| G | X | ① | 1 | 1 | 0 |
| H | X | 0 | ① | 1 | 0 |

FIG. 2C

|   | S1' | S2 | S3 | S4 | S5 |
|---|---|---|---|---|---|
| A | ① | 1 | 0 | 1 | 1 |
| B | 1 | ⓪ | 0 | 1 | 0 |
| C | 0 | 1 | ⓪ | 0 | 1 |
| D | 1 | 1 | 1 | ① | 0 |
| E | X | 0 | 0 | 1 | ① |
| F | X | 0 | 1 | 0 | 0 |
| G | X | ① | 1 | 1 | 0 |
| H | X | 0 | ① | 1 | 0 |

FIG. 2D

|   | S1' | S2 | S3 | S4 | S5 |
|---|---|---|---|---|---|
| A | ① | 1 | 0 | 1 | 1 |
| B | 1 | ⓪ | 0 | 1 | 0 |
| C | 0 | 1 | ⓪ | 0 | 1 |
| D | 1 | 1 | 1 | ① | 0 |
| E | 0 | 0 | 0 | 1 | ① |
| F | ① | 0 | 1 | 0 | 0 |
| G | 1 | ① | 1 | 1 | 0 |
| H | 0 | 0 | ① | 1 | 0 |

FIG. 2E

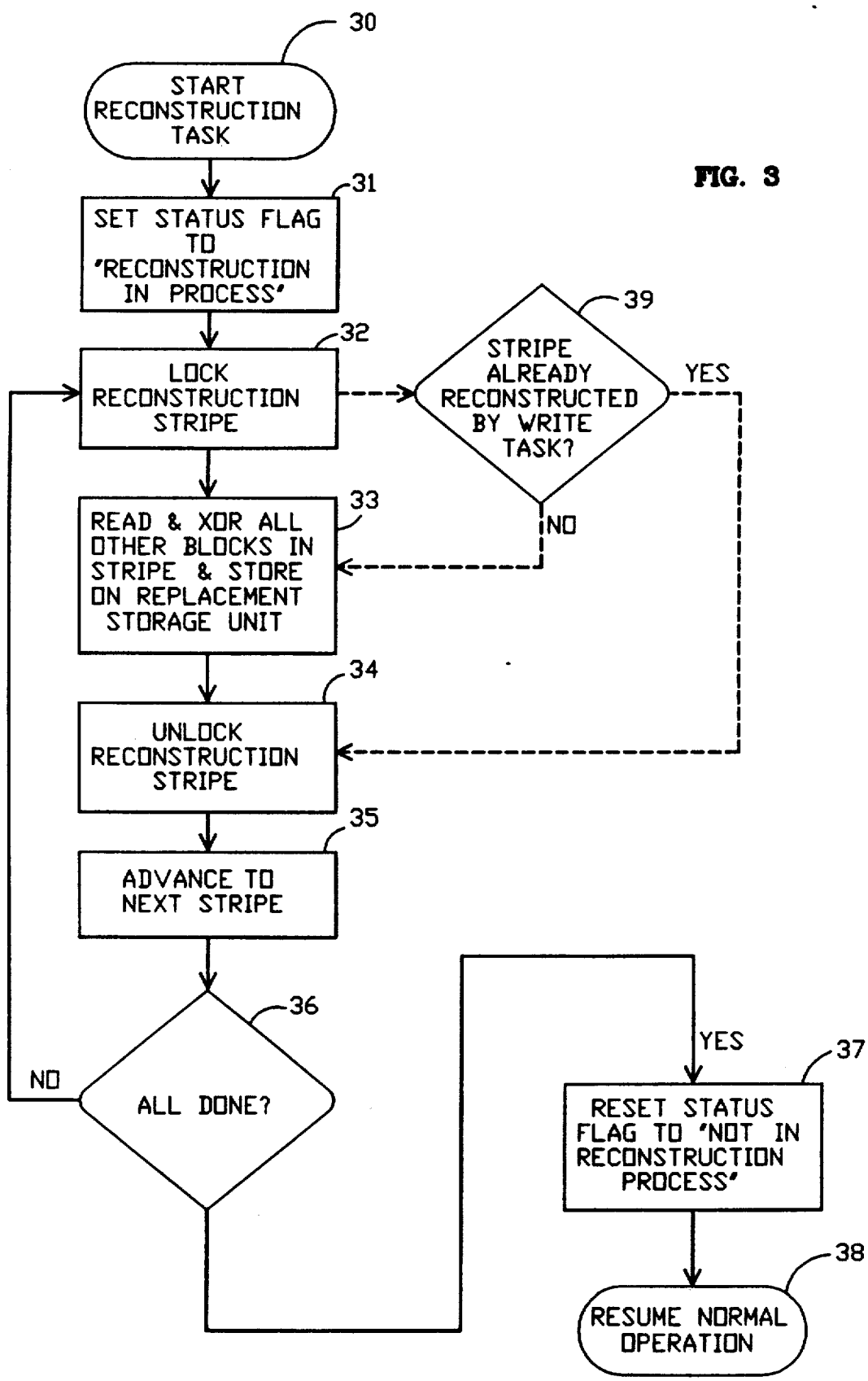

ON-LINE RECONSTRUCTION OF A FAILED REDUNDANT ARRAY SYSTEM

BACKGROUND OF THE INVENTION

1. Field of the Invention

This invention relates to computer system data storage, and more particularly to a method for on-line reconstruction of a failed storage unit in a redundant array system.

2. Description of Related Art

A typical data processing system generally involves one or more storage units which are connected to a Central Processor Unit (CPU) either directly or through a control unit and a channel. The function of the storage units is to store data and programs which the CPU uses in performing particular data processing tasks.

Various type of storage units are used in current data processing systems. A typical system may include one or more large capacity tape units and/or disk drives (magnetic, optical, or semiconductor) connected to the system through respective control units for storing data.

However, a problem exists if one of the large capacity storage units fails such that information contained in that unit is no longer available to the system. Generally, such a failure will shut down the entire computer system.

The prior art has suggested several ways of solving the problem of providing reliable data storage. In systems where records are relatively small, it is possible to use error correcting codes which generate ECC syndrome bits that are appended to each data record within a storage unit. With such codes, it is possible to correct a small amount of data that may be read erroneously. However, such codes are generally not suitable for correcting or recreating long records which are in error, and provide no remedy at all if a complete storage unit fails. Therefore, a need exists for providing data reliability external to individual storage units.

Other approaches to such "external" reliability have been described in the art. A research group at the University of California, Berkeley, in a paper entitled "A Case for Redundant Arrays of Inexpensive Disks (RAID)", Patterson, et al., *Proc. ACM SIGMOD*, June 1988, has catalogued a number of different approaches for providing such reliability when using disk drives as storage units. Arrays of disk drives are characterized in one of five architectures, under the acronym "RAID" (for Redundant Arrays of Inexpensive Disks).

A RAID 1 architecture involves providing a duplicate set of "mirror" storage units and keeping a duplicate copy of all data on each pair of storage units. While such a solution solves the reliability problem, it doubles the cost of storage. A number of implementations of RAID 1 architectures have been made, in particular by Tandem Corporation.

A RAID 2 architecture stores each bit of each word of data, plus Error Detection and Correction (EDC) bits for each word, on separate disk drives (this is also known as "bit stripping"). For example, U.S. Pat. No. 4,722,085 to Flora et al. discloses a disk drive memory using a plurality of relatively small, independently operating disk subsystems to function as a large, high capacity disk drive having an unusually high fault tolerance and a very high data transfer bandwidth. A data organizer adds 7 EDC bits (determined using the well-known Hamming code) to each 32-bit data word to provide error detection and error correction capability. The resultant 39-bit word is written, one bit per disk drive, on to 39 disk drives. If one of the 39 disk drives fails, the remaining 38 bits of each stored 39-bit word can be used to reconstruct each 32-bit data word on a word-by-word basis as each data word is read from the disk drives, thereby obtaining fault tolerance.

An obvious drawback of such a system is the large number of disk drives required for a minimum system (since most large computers use a 32-bit word), and the relatively high ratio of drives required to store the EDC bits (7 drives out of 39). A further limitation of a RAID 2 disk drive memory system is that the individual disk actuators are operated in unison to write each data block, the bits of which are distributed over all of the disk drives. This arrangement has a high data transfer bandwidth, since each individual disk transfers part of a block of data, the net effect being that the entire block is available to the computer system much faster than if a single drive were accessing the block. This is advantageous for large data blocks. However, this arrangement also effectively provides only a single read/write head actuator for the entire storage unit. This adversely affects the random access performance of the drive array when data files are small, since only one data file at a time can be accessed by the "single" actuator. Thus, RAID 2 systems are generally not considered to be suitable for computer systems designed for On-Line Transaction Processing (OLTP), such as in banking, financial, and reservation systems, where a large number of random accesses to many small data files comprises the bulk of data storage and transfer operations.

A RAID 3 architecture is based on the concept that each disk drive storage unit has internal means for detecting a fault or data error. Therefore, it is not necessary to store extra information to detect the location of an error; a simpler form of parity-based error correction can thus be used. In this approach, the contents of all storage units subject to failure are "Exclusive OR'd" (XOR'd) to generate parity information. The resulting parity information is stored in a single redundant storage unit. If a storage unit fails, the data on that unit can be reconstructed on to a replacement storage unit by XOR'ing the data from the remaining storage units with the parity information. Such an arrangement has the advantage over the mirrored disk RAID 1 architecture in that only one additional storage unit is required for "N" storage units. A further aspect of the RAID 3 architecture is that the disk drives are operated in a coupled manner, similar to a RAID 2 system, and a single disk drive is designated as the parity unit.

One implementation of a RAID 3 architecture is the Micropolis Corporation Parallel Drive Array, Model 1804 SCSI, that uses four parallel, synchronized disk drives and one redundant parity drive. The failure of one of the four data disk drives can be remedied by the use of the parity bits stored on the parity disk drive. Another example of a RAID 3 system is described in U.S. Pat. No. 4,092,732 to Ouchi. A RAID 3 disk drive memory system has a much lower ratio of redundancy units to data units than a RAID 2 system. However, a RAID 3 system has the same performance limitation as a RAID 2 system, in that the individual disk actuators are coupled, operating in unison. This adversely affects the random access performance of the drive array when data files are small, since only one data file at a time can be accessed by the "single" actuator. Thus, RAID 3 systems are generally not considered to be suitable for computer systems designed for OLTP purposes.

A RAID 4 architecture uses the same parity error correction concept of the RAID 3 architecture, but improves on the performance of a RAID 3 system with respect to random reading of small files by "uncoupling" the operation of the individual disk drive actuators, and reading and writing a larger minimum amount of data (typically, a disk sector) to each disk (this is also known as block stripping). A further aspect of the RAID 4 architecture is that a single storage unit is designated as the parity unit.

A limitation of a RAID 4 system is that Writing a data block on any of the independently operating data storage units also requires writing a new parity block on the parity unit. The parity information stored on the parity unit must be read and XOR'd with the old data (to "remove" the information content of the old data), and the resulting sum must then be XOR'd with the new data (to provide new parity information). Both the data and the parity records then must be rewritten to the disk drives. This process is commonly referred to as a "Read-Modify-Write" sequence.

Thus, a Read and a Write on the single parity unit occurs each time a record is changed on any of the data storage units covered by the parity record on the parity unit. The parity unit becomes a bottle-neck to data writing operations since the number of changes to records which can be made per unit of time is a function of the access rate of the parity unit, as opposed to the faster access rate provided by parallel operation of the multiple data storage units. Because of this limitation, a RAID 4 system is generally not considered to be suitable for computer systems designed for OLTP purposes. Indeed, it appears that a RAID 4 system has not been implemented for any commercial purpose.

A RAID 5 architecture uses the same parity error correction concept of the RAID 4 architecture and independent actuators, but improves on the writing performance of a RAID 4 system by distributing the data and parity information across all of the available disk drives. Typically, "N×1" storage units in a set (also known as a "redundancy group") are divided into a plurality of equally sized address areas referred to as blocks. Each storage unit generally contains the same number of blocks. Blocks from each storage unit in a redundancy group having the same unit address ranges are referred to as "stripes". Each stripe has N blocks of data, plus one parity block on one storage device containing parity for the remainder of the stripe. Further stripes each have a parity block, the parity blocks being distributed on different storage units. Parity updating activity associated with every modification of data in a redundancy group is therefore distributed over the different storage units. No single unit is burdened with all of the parity update activity.

For example, in a RAID 5 system comprising 5 disk drives, the parity information for the first stripe of blocks may be written to the fifth drive; the parity information for the second stripe of blocks may be written to the fourth drive; the parity information for the third stripe of blocks may be written to the third drive; etc. The parity block for succeeding stripes typically "precesses" around the disk drives in a helical pattern (although other patterns may be used).

Thus, no single disk drive is used for storing the parity information, and the bottle-neck of the RAID 4 architecture is eliminated. An example of RAID 5 system is described in U.S. Pat. No. 4,914,656 to Clark et al.

As in a RAID 4 system, a limitation of a RAID 5 system is that a change in a data block requires a Read-Modify-Write sequence comprising two Read and two Write operations: the old parity block and old data block must be read and XOR'd, and the resulting sum must then be XOR'd with the new data. Both the data and the parity blocks then must be rewritten to the disk drives. While the two Read operations may be done in parallel, as can the two Write operations, modification of a block of data in a RAID 4 or a RAID 5 system still takes substantially longer then the same operation on a conventional disk. A conventional disk does not require the preliminary Read operation, and thus does have to wait for the disk drives to rotate back to the previous position in order to perform the Write operation. The rotational latency time alone can amount to about 50% of the time required for a typical data modification operation. Further, two disk storage units are involved for the duration of each data modification operation, limiting the throughput of the system as a whole.

Despite the Write performance penalty, RAID 5 type systems have become increasingly popular, since they provide high data reliability with a low overhead cost for redundancy, good Read performance, and fair Write performance.

A RAID 5 architecture has particular utility in OLTP computer systems. Many OLTP systems must be high-availability systems, meaning that complete failure of the system has a low-probability. High availability can be achieved by using high-reliability components, having a fault-tolerant design with a low mean-time-to-repair (MTTR), and designing for "staged" degradation, where the failure of a component may reduce system capability but without causing total system failure.

Although a principal feature of a RAID system is fault-tolerance, such capability alone does not guarantee a high-availability system. If a storage unit fails, general system operation cannot continue until the failed storage unit is replaced and the information on it is restored. When a storage unit fails in a RAID architecture, the art teaches that a replacement storage unit is substituted for the failed storage unit (either manually or electronically switched in from a set of one or more spares), and the "lost" data is reconstructed on the replacement storage unit by XOR'ing each parity block with all corresponding data blocks from the remaining storage unit drives in the redundancy group. This operation is straightforward if the entire redundancy group can be dedicated to reconstructing the failed storage unit. However, it appears that the art teaches or suggests restoring the data on the replacement storage unit as a separate procedure before general system operation can be recommenced. Such a method for reconstruction does not provide for high availability.

Thus, so far as known, the art does not teach reconstructing a failed storage unit in a RAID architecture while continuing to provide on-line access to the entire redundancy group.

It thus would be highly desirable to have a RAID architecture system in which reconstruction of a failed storage unit can be conducted "on-line", while general system operation continues in a normal fashion. It is also desirable to be able to suffer a power failure with the reconstruction operation in progress and never present bad data as good data to the CPU.

The present invention provides such a system.

SUMMARY OF THE INVENTION

The present invention provides a method for on-line reconstruction of a failed RAID data storage unit. After providing a replacement storage unit for the failed storage unit, a reconstruction task begins for the array. General reconstruction consists of applying an error-correction operation (such as an XOR operation on data blocks and a corresponding parity block, or a Reed-Solomon code) to the data blocks from the remaining storage units in the redundancy group, and storing the result in the corresponding block of the replacement storage unit.

If a Read operation is requested by the CPU for a data block on the replacement storage unit, then a concurrent Read task is executed which reconstructs the stripe containing the requested data block.

If a Read operation is requested by the CPU for a data block not on the replacement storage unit, then a concurrent Read task is executed which performs a normal Read.

If a Write operation is requested for any data block, then a concurrent Write task is executed which performs a Read-Modify-Write sequence in the general case (the Read operation being performed in accordance with the above rules).

Although data blocks on the replacement storage unit "above" the reconstruction stripe are valid, and could be read directly, the above procedure is easier and simpler to implement, since there is no need to keep track of whether or not a requested data block is "above" the reconstruction stripe. However, in an alternative embodiment of the invention, the position of a requested data block with respect to the reconstruction stripe is tracked, and reconstruction is only performed for data blocks that are not above the reconstruction stripe.

Thus, the general rules of operation in the preferred embodiment are that all Read operations from the replacement storage unit require on-the-fly reconstruction of all of the data blocks requested, regardless of whether any of those data blocks have in fact been reconstructed by the general reconstruction process. All write operations proceed in a Read-Modify-Write sequence in the general case, with the Read part of the operation being performed in accordance with the above rules.

The present invention provides a reliable method of reconstructing all of the data of a failed storage unit onto a replacement unit, while continuing to permit Reading and Writing operations to the storage unit array as a whole, and to the replacement storage unit in particular. Use of a flag permits detection of an abnormal termination of the general reconstruction process. The reconstruction may resume either at the initial reconstruction starting point, or, optionally, at the point of abnormal termination.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 2A is a diagram of a model RAID 5 system, showing an initial state.

FIG. 2B is a diagram of a model RAID 5 system, showing a failed storage unit.

FIG. 2C is a diagram of a model RAID 5 system, showing an initialized replacement storage unit.

FIG. 2D is a diagram of a model RAID 5 system, showing a partially reconstructed replacement storage unit.

FIG. 2E is a diagram of a model RAID 5 system, showing a completely reconstructed replacement storage unit.

FIG. 3 is a flowchart representing the general reconstruction process for the preferred embodiment of the present invention.

Like reference numbers and designations in the drawings refer to like elements.

DETAILED DESCRIPTION OF THE INVENTION

Throughout this description, the preferred embodiment and examples shown should be considered as exemplars, rather than limitations on the method of the present invention.

Figure 1:
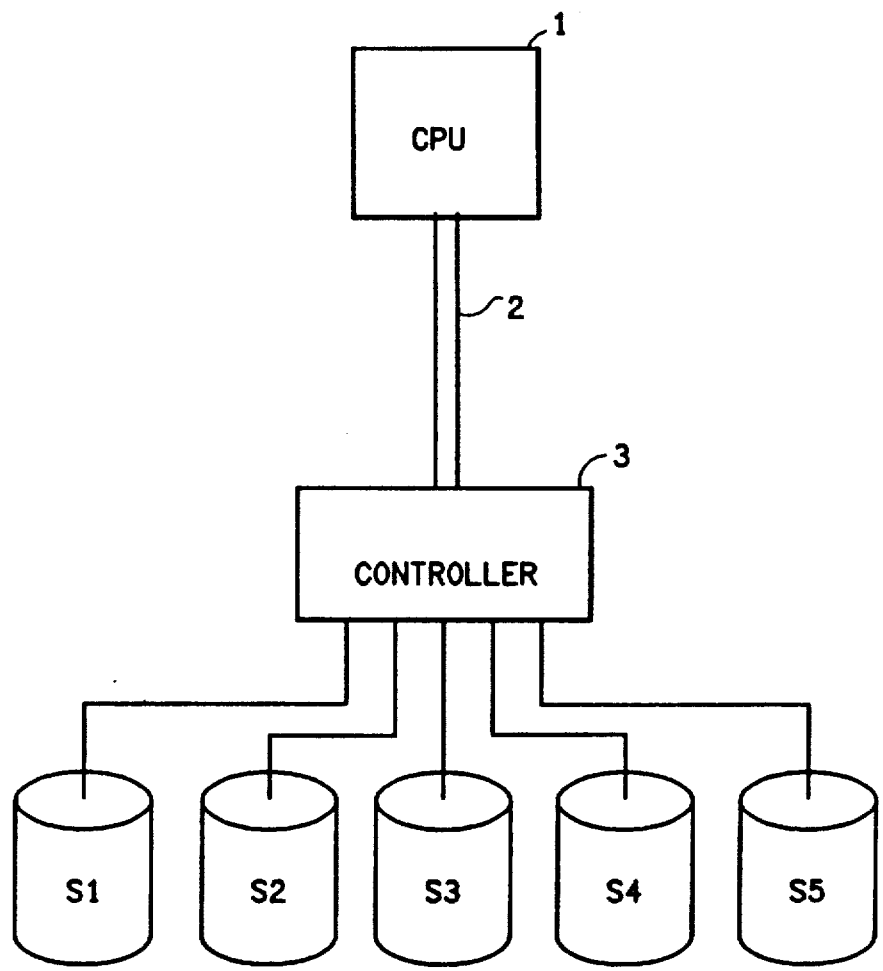
FIG. 1 is block diagram of a generalized RAID system in accordance with the present invention.

FIG. 1 is block diagram of a generalized RAID system in accordance with the present invention. Shown are a CPU 1 coupled by a bus 2 to an array controller 3. The array controller 3 is coupled to each of the plurality of storage units S1-S5 (five being shown by way of example only) by an I/O bus (e.g., a SCSI bus). The array controller 3 is preferably includes a separately programmable, multi-tasking processor (for example, the MIPS R3000 RISC processor, made by MIPS of Sunnyvale, Calif.) which can act independently of the CPU 1 to control the storage units.

The storage units S1-S5 can be grouped into one or more redundancy groups. In the illustrated examples described below, the redundancy group comprises all of the storage units S1-S5, for simplicity of explanation.

Figure 4:
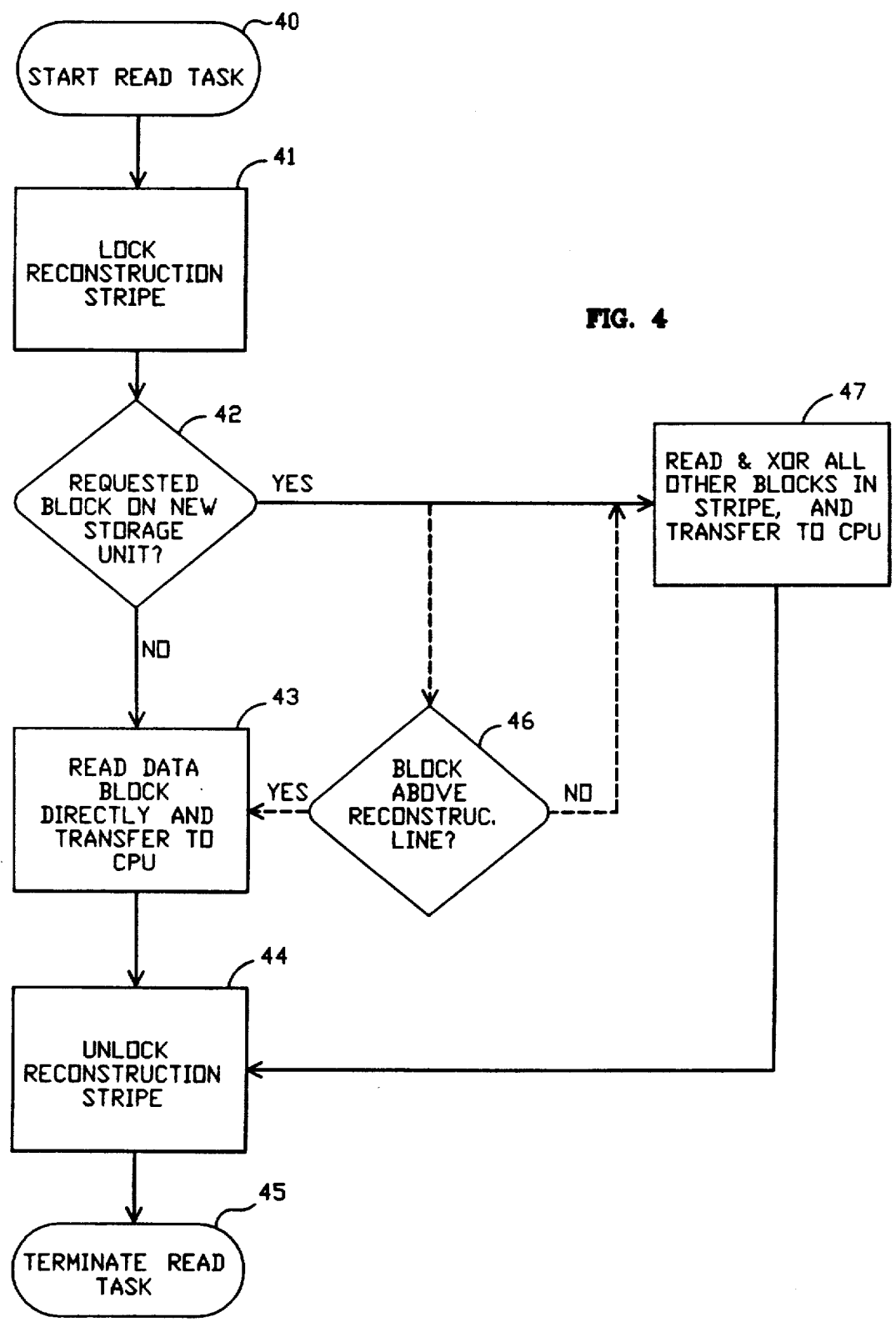
FIG. 4 is a flowchart representing a Read operation for the preferred embodiment of the present invention.
Figure 5:
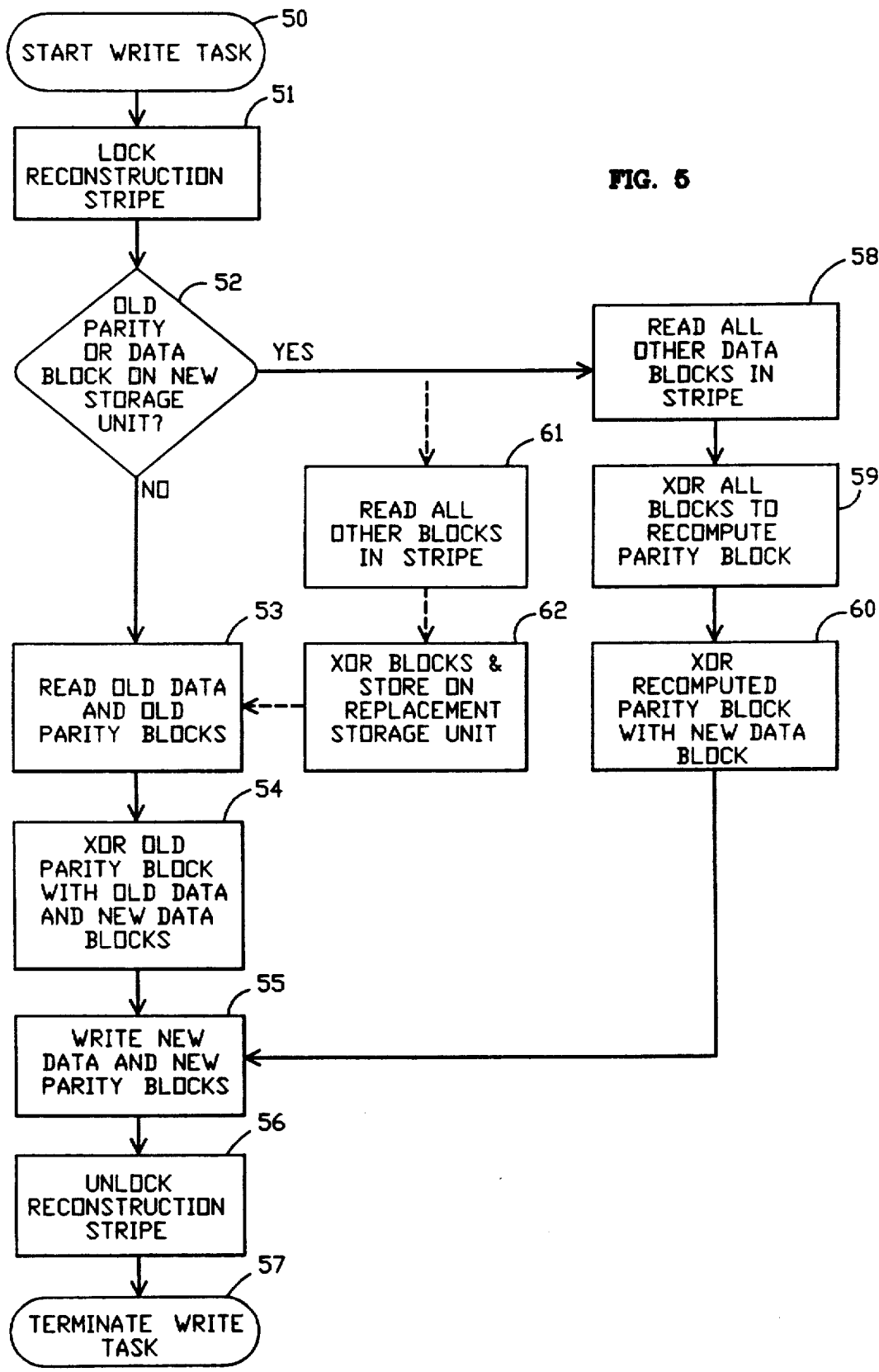
FIG. 5 is a flowchart representing a Write operation for the preferred embodiment of the present invention.

The present invention is preferably implemented as a multi-tasking computer program executed by the controller 3. FIGS. 2A-2E are diagrammatic models of a RAID 5 system. FIG. 3 is a high-level flowchart representing the steps of the general reconstruction process for the preferred embodiment of the invention. FIG. 4 is a high-level flowchart representing the steps of a Read operation for the preferred embodiment of the invention. FIG. 5 is a high-level flowchart representing the steps of a Write operation for the preferred embodiment of the invention. The steps referenced in FIGS. 3-5 are referenced below.

General Reconstruction

FIG. 2A is a diagram of a model RAID system, showing an initial state. The illustrated array comprises five storage units, S1-S5. Each row A-H is a stripe. Parity information is indicated by circled numbers, and is spread throughout the array. Although one pattern of parity information distribution is shown, the invention encompasses any distribution. One bit "blocks" are shown for each storage unit in a stripe for simplicity. Each block could instead be any other unit of size, such as a byte, sector, or group of sectors. In the preferred embodiment, each block is at least one sector in size.

FIG. 2B shows the same RAID model as FIG. 2A, but with storage unit S1 having failed (the dashes representing corrupted data). Note that the XOR sum of each stripe for storage units S2-S5 equals the lost data of storage unit S1 shown in FIG. 2A.

FIG. 2C shows the same RAID model as FIG. 2B, but with failed storage unit S1 having been replaced by a replacement storage unit S1'. The replacement may be on a physical basis (i.e., a new storage unit being physically substituted for the failed unit), or on a logical basis (i.e., a spare storage unit in communication with the controller 3 being electronically switched into operation). In the illustrated embodiment, the replacement storage unit S1' has not been initialized to any particular data pattern, as indicated by the x's, but the unit could have any pattern of information on it.

Once the replacement storage unit S1' is substituted for the failed storage unit S1, the general reconstruction process commences as a task (FIG. 3, Step 30). The replacement storage unit S1' is marked internally to indicate that the storage unit is "Under Reconstruction" and being reconstructed (Step 31).

FIG. 2D illustrates an intermediate stage of reconstruction, with stripe D, shown highlighted, as the reconstruction stripe. In the preferred embodiment, a Write operation that requires reconstruction of a stripe cannot be made to the reconstruction stripe because that stripe is "locked", in known fashion, to prevent alteration while undergoing reconstruction (Step 32). Therefore, the Write operation is delayed until the stripe is reconstructed.

In the preferred embodiment, the data and parity blocks are Read from storage units S2-S5 for each stripe A-H in the array and XOR'd, with the result from each stripe being stored in the corresponding block of the replacement storage unit S1' (Step 33). In the example shown in FIG. 2, this process begins at stripe A and proceeds to the end of the storage units, at stripe H. However, any starting point may be used, with any pattern of reconstruction (e.g., alternating stripes).

The controller 3 then unlocks the reconstruction stripe (Step 34), and advances the reconstruction stripe (Step 35). If reconstruction is incomplete (Step 36), the general reconstruction process continues (Step 32) until the entire replacement storage unit S1' is reconstructed, as shown in FIG. 2E. When the general reconstruction process is completed (Step 36), the replacement storage unit S1' is marked as "Not Under Reconstruction" (Step 37) and will operate normally (Step 38).

If the reconstruction process is interrupted due to a power failure or any other reason, the last step of marking the replacement storage unit S1' as "Not Under Reconstruction" will not be completed. It is therefore possible to detect such an abnormal termination. In such a case, the controller 3 may restart the reconstruction process from the beginning without losing any data. This may result in correcting stripes that have already been corrected, but this approach guarantees that the array subsystem will never indicate that data is good when it has not been reconstructed.

In alternative embodiment, after each section of the replacement storage unit (e.g., each cylinder of a disk drive) is reconstructed, a flag field in the replacement storage unit S1' (or elsewhere, if desired) is marked internally to indicate the last section that has been reconstructed. After an abnormal termination, the reconstruction process may be restarted after the last indicated section, thereby saving reconstruction time.

Concurrent I/O Tasks

During the general reconstruction process, processing by the CPU 1 can continue, but with some possible performance degradation for the computer system. As described below, the general reconstruction process may be interrupted to permit a Read or Write operation requested by the CPU 1 (Steps 33, 35). Such interruptions are preferably implemented by the means of concurrent tasks in well-known fashion. However, the invention encompasses any means of concurrent and/or interrupt-driven I/O operation. Following is a description of the preferred embodiments of such Read and Write operations.

Read Operations

If a Read operation is requested by the CPU 1 during general reconstruction, a Read process begins as an independent but concurrent task (FIG. 4, Step 40). This means that the reconstruction task continues to execute, but that the Read task and reconstruction task contend for system resources, in known fashion.

The controller 3 preferably locks the reconstruction stripe to prevent inadvertent alteration of the stripe undergoing reconstruction (Step 41). If the Read request is for a data block not on the replacement (or "new") storage unit S1' (Step 42), the controller 3 performs a normal Read operation and transfers the data block to the CPU 1 (Step 43). Because data from the other storage units (S2-S5 in the example of FIG. 2) is correct, no loss of performance occurs. The controller 3 then unlocks the reconstruction stripe (Step 44), and the Read task terminates (Step 45).

If the Read operation requested by the CPU 1 is for a data block on the replacement storage unit S1' (Step 42), the procedure is different. The controller 3 instead reconstructs the stripe containing the requested data block "on-the-fly". The controller 3 reads all of the other data and the corresponding parity block in the stripe (Step 47). The blocks are then XOR'd to generate a corrected data block, which is then transferred to the CPU 1 via the controller 3 (Step 48). Thereafter, the controller 3 unlocks the reconstruction stripe (Step 44), and the Read task terminates (Step 45).

FIG. 2D illustrates both cases of Reading. Stripe D, shown highlighted, is the reconstruction stripe. If a Read request is made for data block A-S2, the controller 3 will access storage unit S2 in stripe A, and directly read a binary 0 from the storage unit for transfer to the CPU 1.

If a Read request is made for data block H-S1, which is not yet reconstructed, the controller 3 will access storage units S2-S5 in stripe H and read all of the blocks. The blocks are then XOR'd, generating a binary 0, which is transferred to the CPU 1.

Similarly, if a Read request is made for data block A-S1, the controller 3 will access storage units S2-S5 in stripe A and read all of the blocks. The blocks are then XOR'd, generating a binary 1, which is transferred to the CPU 1.

Thus, for all Read operations in the preferred embodiment, the data will always be corrected by reconstruction even though the CPU 1 may be reading from a stripe that is already reconstructed and the CPU 1 therefore could have read the data directly. The additional time to correct good data will only be incurred during the reconstruction process, which should occur infrequently. This approach allows the data storage subsystem to always maintain and present correct data without having to keep track of whether or not a requested data block is "above" the reconstruction stripe.

Alternatively, the Read task *does* keep track of whether or not a requested data block is "above" the reconstruction stripe. Referring to FIG. 4, after the controller determines that a requested data block is on the replacement storage unit S1' (Step 42), the controller compares the position of the requested data block in the storage unit S1 with the current position of the reconstruction stripe (Step 46, indicated as optional by dashed lines). If the requested block is not above the reconstruction line, the controller 3 reconstructs the stripe containing the requested data block "on-the-fly" by reading and XOR'ing all of the other data blocks and the corresponding parity block in the stripe (Steps 47 and 48). However, if the requested block is "above" the reconstruction line, the block has already been reconstructed. Therefore, the controller 3 performs a normal Read of the data block and transfers the data block to the CPU 1 (Step 43). While this approach requires tracking whether or not a requested data block is "above" the reconstruction stripe, time is saved in Reading previously reconstructed data blocks on the replacement storage unit.

Write Operations

If a Write operation is requested by the CPU 1 during general reconstruction, a Write process begins as an independent but concurrent task (FIG. 5, Step 50). This means that the reconstruction task continues to execute, but that the Write task and reconstruction task contend for system resources, in known fashion.

The controller 3 locks the reconstruction stripe to prevent inadvertent alteration of the stripe undergoing reconstruction (Step 51). If the Write operation requested is for a data block and corresponding parity block not on the replacement storage unit S1' (Step 52), the controller 3 performs a normal Read-Modify-Write sequence. That is, the old parity block and old data block are Read from the array (Step 53), and the old parity block is modified by "subtracting out" (XOR'ing) the old data block and "adding in" (XOR'ing) the new data block (Step 54). The new parity block and the new data block are then Written to the array (Step 55). After the Write operation is completed, the controller 3 unlocks the reconstruction stripe (Step 56), and the Write task terminates (Step 57).

It does not matter in this case whether or not the corresponding data block on the replacement storage unit S1' has been corrected. Because the requested data block and its parity block are not on the replacement storage unit S1', the Read part of the Read-Modify-Write sequence does not need to reconstruct the data. Thus, essentially no loss of performance occurs.

If the Write operation requested by the CPU 1 is for a data block where either the data block or its corresponding parity block are on the replacement storage unit S1' (Step 52), the procedure is different. The controller 3 instead recomputes a parity block for the stripe "on-the-fly" by reading all of the other data blocks in the stripe (Step 58) and XOR'ing them (Step 59). The new data block is then XOR'd with the recomputed parity block to generate a new parity block (Step 60). The new data block overwrites the old data block and the new parity block overwrites the old parity block (Step 55). After the Write operation is completed, the controller 3 unlocks the reconstruction stripe (Step 56), and the Write task terminates (Step 57).

An alternative procedure, indicated by dashed lines in FIG. 5, is to first reconstruct the block on the replacement storage unit S1'. The controller 3 reads all of the other blocks in the stripe (Step 61), and then XOR's them (Step 62). The result may be stored on the replacement storage unit S1' (Step 62) or in a temporary memory. The reconstructed block can then be used in a normal Read-Modify-Write sequence (Steps 53-57).

It should be noted that the above discussion of a Write operation pertains to the general case of less than all of the blocks in a stripe being modified. In the special case where all blocks in a stripe are being modified, then the Read-Modify-Write sequence is unnecessary. That is, the initial Read operation is not required, since the parity block for the stripe can be computed based solely on the new data. The computed parity block and the new data blocks are then simply stored on the stripe. Strictly speaking, no "reconstruction" of the stripe is performed.

If the CPU 1 Writes to stripes that have already been corrected, the new data is recorded correctly. If the CPU 1 Writes to stripes that have not yet been corrected, the new data is recorded correctly and will be "corrected" again (although it is no longer incorrect) when the reconstruction stripe advances to the stripe containing the new data. The additional time to re-correct good data will be incurred with diminishing frequency during the reconstruction process as the reconstruction stripe advances. This approach allows the data storage subsystem to always maintain and present correct data without having to keep track of whether or not a requested data block is "above" or "below" the reconstruction stripe.

Alternatively, and additional step may be added to the reconstruction task (FIG. 3) to test whether a stripe has already been reconstructed by a Write operation (Step 32'). If reconstruction has already occurred, the current reconstruction stripe may be unlocked and processing continued at a next stripe (Steps 34 and 35). If reconstruction has not occurred, the general reconstruction task continues execution (Step 33).

A number of embodiments of the present invention have been described. Nevertheless, it will be understood that various modifications may be made without departing from the spirit and scope of the invention. For example, the present invention can be used with RAID 3, RAID 4, or RAID 5 systems. Furthermore, an error-correction method in addition to or in lieu of the XOR-generated parity may be used for the necessary redundancy information. One such method using Reed-Solomon codes is disclosed in U.S. patent application Ser. No. 270,713, filed Nov. 14, 1988, entitled "Arrayed Disk Drive System and Method" and assigned to the assignee of the present invention. With the structure and method taught by that reference, the present invention can accommodate the loss of two storage units if both XOR and Reed-Solomon (or any other system) redundancy is used. Accordingly, it is to be understood that the invention is not to be limited by the specific illustrated embodiment, but only by the scope of the appended claims.

I claim:

1. A method for on-line reconstruction of a failed data storage unit in a redundant array of storage units coupled to a controller, the storage units having a plurality of stripes each containing a plurality of data blocks and at least one associated error-correction block, comprising the steps of:
   a. providing a replacement storage unit for the failed storage unit;
   b. reconstructing the data block of the failed storage unit for each stripe in the array;
   c. storing the reconstructed data block on the replacement storage unit in the corresponding stripe;
   d. if the controller requests a read operation for a data block during reconstruction, then:
      (1) if the requested data block is located on the replacement storage unit, then:
         (a) accessing all of the other data blocks and at least one corresponding error-correction block in the stripe containing the requested data block;
         (b) reconstructing the requested data block from the accessed blocks;
      (2) if the requested data block is not located on the replacement storage unit, then:
         accessing the requested data block directly.

2. A method for on-line reconstruction of a failed data storage unit in a redundant array of storage units coupled to a controller, the storage units having a plurality of stripes each containing a plurality of data blocks and at least one associated error-correction block, comprising the steps of:
   a. providing a replacement storage unit for the failed storage unit;
   b. reconstructing the data block of the failed storage unit for each stripe in the array;
   c. storing the reconstructed data block on the replacement storage unit in the corresponding stripe;
   d. if the controller requests a write operation for a new data block during reconstruction, then:
      (1) if the data block to be modified and its at least one associated error-correction block are not located on the replacement storage unit, then:
         (a) updating the at least one associated error-correction block in the stripe containing the data block to be modified;
         (b) writing the updated at least one error-correction block and the new data block in the stripe containing the data block to be modified;
      (2) if the data block to be modified is located on the replacement storage unit, then:
         (a) accessing all of the other blocks in the stripe containing the data block to be modified;
         (b) reconstructing the data block to be modified from the accessed blocks;
         (c) updating the at least one associated error-correction block in the stripe containing the data block to be modified;
         (d) writing the updated at least one error-correction block and the new data block in the stripe containing the data block to be modified.

3. The method of claim 2, wherein the write operation step includes the further steps of:
   a. if the at least one error-correction block associated with the data block to be modified is located on the replacement storage unit, then:
      (1) accessing all of the other data blocks in the stripe containing the data block to be modified;
      (2) computing at least one error-correction block from the accessed blocks and the new data block;
      (3) writing the computed at least one error-correction block and the new data block in the stripe containing the data block to be modified.

4. A method for on-line reconstruction of a failed data storage unit in a redundant array of storage units coupled to a controller, the storage units having a plurality of stripes each containing a plurality of data blocks and at least one associated error-correction block, comprising the steps of:
   a. providing a replacement storage unit for the failed storage unit;
   b. reconstructing the data block of the failed storage unit for each stripe in the array;
   c. storing the reconstructed data block on the replacement storage unit in the corresponding stripe;
   d. if the controller requests a write operation for a new data block during reconstruction, then:
      (1) if the data block to be modified and its at least one associated error-correction block are not located on the replacement storage unit, then:
         (a) updating the at least one associated error-correction block in the stripe containing the data block to be modified;
         (b) writing the updated at least one error-correction block and the new data block in the stripe containing the data block to be modified;
      (2) if the data block to be modified or its at least one associated error-correction block are located on the replacement storage unit, then:
         (a) accessing all of the other data blocks in the stripe containing the data block to be modified;
         (b) computing at least one error-correction block from the accessed blocks and the new data block;
         (c) writing the computed at least one error-correction block and the new data block in the stripe containing the data block to be modified.

5. The method of claim 1, further including the steps of:
   a. if the controller requests a write operation for a new data block during reconstruction, then:
      (1) if the data block to be modified and its at least one associated error-correction block are not located on the replacement storage unit, then:
         (a) updating the at least one associated error-correction block in the stripe containing the data block to be modified;
         (b) writing the updated at least one error-correction block and the new data block in the stripe containing the data block to be modified;
      (2) if the data block to be modified is located on the replacement storage unit, then:
         (a) accessing all of the other blocks in the stripe containing the data block to be modified;
         (b) reconstructing the data block to be modified from the accessed blocks;
         (c) updating the at least one associated error-correction block in the stripe containing the data block to be modified;
         (d) writing the updated at least one error-correction block and the new data block in the stripe containing the data block to be modified.

6. The method of claim 5, wherein the write operation step includes the further steps of:
   a. if the at least one error-correction block associated with the data block to be modified is located on the replacement storage unit, then:
      (1) accessing all of the data blocks in the stripe containing the data block to be modified;

(2) computing at least one error-correction block from the accessed blocks and the new data block;

(3) writing the computed at least one error-correction block and the new data block in the stripe containing the data block to be modified.

7. The method of claim 1, further including the steps of:

a. if the controller requests a write operation for a new data block during reconstruction, then:

(1) if the data block to be modified and its at least one associated error-correction block are not located on the replacement storage unit, then:

(a) updating the at least one associated error-correction block in the stripe containing the data block to be modified;

(b) writing the updated at least one error-correction block and the new data block in the stripe containing the data block to be modified;

(2) if the data block to be modified or its at least one associated error-correction block are located on the replacement storage unit, then:

(a) accessing all of the other data blocks in the stripe containing the data block to be modified;

(b) computing at least one error-correction block from the accessed blocks and the new data block;

(c) writing the computed at least one error-correction block and the new data block in the stripe containing the data block to be modified.

8. The method of claims 1, 2, or 4, wherein at least one error-correction block contains parity information, and the step of reconstructing each data block of the failed storage unit comprises the steps of:

a. accessing all of the other data blocks and the corresponding parity error-correction block in the corresponding stripe;

b. exclusively-OR'ing all of the accessed blocks to generate a new data block.

9. The method of claims 2, 4, 5, or 7, wherein at least one error-correction block contains parity information, and the step of updating the at least one associated error-correction block during a write operation comprises the steps of:

a. reading the data block to be modified and the associated parity error-correction block;

b. exclusively-OR'ing the parity error-correction block with the data block to be modified and the new data block to generate an updated parity error-correction block.

10. The method of claims 3, 4, 6, or 7, wherein the step of computing at least one error-correction block during a write operation comprises exclusively-OR'ing the accessed blocks and the new data block.

11. The method of claim 1, wherein the step of reconstructing the requested data block from the accessed blocks comprises exclusively-OR'ing the accessed blocks.

12. The method of claims 2 or 5, wherein the step of reconstructing the data block to be modified from the accessed blocks comprises exclusively-OR'ing the accessed blocks.

13. The method of claims 1, 5, or 7, wherein when the requested data block is located on the replacement storage unit:

a. if the block has previously been reconstructed, then:

(1) accessing the requested data block directly;

b. otherwise:

(1) accessing all of the other data blocks and at least one corresponding error-correction block in the stripe containing the requested data block;

(2) reconstructing the requested data block from the accessed blocks.

14. The method of claims 1, 2, or 4, wherein the step of reconstructing the data block of the failed storage unit for each stripe in the array is performed only for stripes that have not previously been reconstructed.

15. A controller for on-line reconstruction to a replacement storage unit of a failed data storage unit in a redundant array of storage units, the storage units having a plurality of stripes each containing a plurality of data blocks and an associated error-correction block, the controller including means for operatively coupling the controller to the array of storage units and means for:

a. reconstructing the data block of the failed storage unit for each stripe in the array and storing the reconstructed data block on the replacement storage unit in the corresponding stripe;

b. reading a requested data block during the reconstruction, by:

(1) if the requested data block is located on the replacement storage unit, then:

(a) accessing all of the other data blocks and the corresponding error-correction block in the stripe containing the requested data block;

(b) reconstructing the requested data block from the accessed blocks;

(2) if the requested data block is not located on the replacement storage unit, then:

(a) accessing the requested data block directly.

16. A controller for on-line reconstruction to a replacement storage unit of a failed data storage unit in a redundant array of storage units, the storage units having a plurality of stripes each containing a plurality of data blocks and an associated error-correction block, the controller including means for operatively coupling the controller to the array of storage units and means for:

a. reconstructing the data block of the failed storage unit for each stripe in the array and storing the reconstructed data block on the replacement storage unit in the corresponding stripe;

b. writing a new data block during the reconstruction, by:

(1) if the data block to be modified and its associated error-correction block are not located on the replacement storage unit, then:

(a) updating the associated error-correction block in the stripe containing the data block to be modified;

(b) writing the updated error-correction block and the new data block in the stripe containing the data block to be modified;

(2) if the data block to be modified is located on the replacement storage unit, then:

(a) accessing all of the other blocks in the stripe containing the data block to be modified;

(b) reconstructing the data block to be modified from the accessed blocks;

(c) updating the associated error-correction block in the stripe containing the data block to be modified;

(d) writing the updated error-correction block and the new data block in the stripe containing the data block to be modified.

17. A controller for on-line reconstruction to a replacement storage unit of a failed data storage unit in a redundant array of storage units, the storage units having a plurality of stripes each containing a plurality of data blocks and an associated error-correction block, the controller including means for operatively coupling the controller to the array of storage units and means for:

a. reconstructing the data block of the failed storage unit for each stripe in the array and storing the reconstructed data block on the replacement storage unit in the corresponding stripe;

b. writing a new data block during the reconstruction, by:

(1) if the data block to be modified and its associated error-correction block are not located on the replacement storage unit, then:

(a) updating the associated error-correction block in the stripe containing the data block to be modified;

(b) writing the updated error-correction block and the new data block in the stripe containing the data block to be modified;

(2) if the data block to be modified or its associated error-correction block are located on the replacement storage unit, then:

(a) accessing all of the other data blocks in the stripe containing the data block to be modified;

(b) computing a error-correction block from the accessed blocks and the new data block;

(c) writing the computed error-correction block and the new data block in the stripe containing the data block to be modified.

* * * * *